US012753490B2

(12) United States Patent
Wang et al.

(10) Patent No.: US 12,753,490 B2
(45) Date of Patent: Oct. 6, 2026

(54) METHOD FOR FORMING ROBUST HYDROPHOBIC SURFACES ON STEEL WORKPIECE

(71) Applicant: Nano and Advanced Materials Institute Limited, Hong Kong (CN)

(72) Inventors: Song Wang, Hong Kong (CN); Chen Xu, Hong Kong (CN); Tianyu Weng, Hong Kong (CN)

(73) Assignee: HONG KONG APPLIED SCIENCE AND TECHNOLOGY RESEARCH INSTITUTE COMPANY LIMITED, Hong Kong (HK)

( * ) Notice: Subject to any disclaimer, the term of this patent is extended or adjusted under 35 U.S.C. 154(b) by 151 days.

(21) Appl. No.: 18/785,683

(22) Filed: Jul. 26, 2024

(65) Prior Publication Data

US 2025/0034697 A1 Jan. 30, 2025

Related U.S. Application Data

(60) Provisional application No. 63/529,204, filed on Jul. 27, 2023.

(51) Int. Cl.

| | |
|---|---|
| ***C23C 14/35*** | (2006.01) |
| ***C09D 183/04*** | (2006.01) |
| ***C23C 14/02*** | (2006.01) |
| ***C23C 14/12*** | (2006.01) |
| ***C23F 1/28*** | (2006.01) |
| ***C25F 3/24*** | (2006.01) |

(52) U.S. Cl.

CPC ............ *C23C 14/35* (2013.01); *C09D 183/04* (2013.01); *C23C 14/021* (2013.01); *C23C 14/028* (2013.01); *C23C 14/12* (2013.01); *C23F 1/28* (2013.01); *C25F 3/24* (2013.01)

(58) Field of Classification Search

None

See application file for complete search history.

(56) References Cited

U.S. PATENT DOCUMENTS

2009/0093611 A1* 4/2009 Yang .................. C08G 59/3254 528/421
2020/0004133 A1* 1/2020 Hsu ........................... G03F 1/22

FOREIGN PATENT DOCUMENTS

CN 105543791 A * 5/2016 ............. C23C 14/46
CN 111020502 A * 4/2020 ......... C23C 14/0641

(Continued)

OTHER PUBLICATIONS

Flower-like Superhydrophobic Surfaces Fabricated on Stainless Steel as a Barrier against Corrosion in Simulated Acid Rain. Materials 2022, 15, 7104 (Year: 2022).*

(Continued)

*Primary Examiner* — Jason Berman

(74) *Attorney, Agent, or Firm* — IDEA Intellectual Limited; Sam T. Yip

(57) ABSTRACT

The present invention discloses a method for forming robust hydrophobic surfaces on a steel workpiece. First, a roughing process is performed on the steel workpiece by removing part of the steel from the surface, so as to form concaves. Second, a depositing process is performed to deposit hydrophobic layers into the concaves, thereby forming the steel workpiece with robust hydrophobic surfaces, exhibiting good abrasion resistance.

22 Claims, 2 Drawing Sheets

(56) References Cited

FOREIGN PATENT DOCUMENTS

| | | | | | |
|---|---|---|---|---|---|
| KR | 19990046514 | A | * | 7/1999 | ................ C25F 7/00 |
| KR | 20090032485 | A | * | 4/2009 | ........... B05D 3/0254 |

OTHER PUBLICATIONS

Effect of Oxyfluorination of PFA-Coated Metal Mesh with Superhydrophobic Properties on the Filtration Performance of SiO2 Microparticles. Molecules 2023, 28, 3110 (Year: 2023).*

* cited by examiner

METHOD FOR FORMING ROBUST HYDROPHOBIC SURFACES ON STEEL WORKPIECE

CROSS REFERENCE TO RELATED APPLICATIONS

This application claims priority to and the benefit of U.S. Provisional Patent Application Ser. No. 63/529,204 filed on Jul. 27, 2023, the disclosure of which is incorporated by reference in its entirety.

TECHNICAL FIELD

The present invention relates to the technical field about material surface modification, in particular to improving the hydrophobic surface with long-term durability of steel materials.

BACKGROUND

Superhydrophobic surfaces have recently received tremendous attention because of special functions such as self-cleaning, corrosion protection, anti-icing, drag reduction and anti-bacteria. Surfaces with water contact angle greater than 150° are generally classified as superhydrophobic surfaces. Many creatures in nature, including the lotus leaf, rice leaf, butterflying wing and water-strider legs exhibit excellent super-hydrophobicity.

Generally, the formation of superhydrophobic surface involves two crucial procedures: the construction of rough surface with micro-/nanoscale roughness, and surface modification for lowering surface free energy. Many approaches for the preparation of superhydrophobic surfaces have been provided, such as electrochemical deposition, plasma method, chemical vapour deposition, wet chemical reaction, hydrothermal method, etc. Many surfaces manufactured by chemical methods have good super-hydrophobicity but low stability and service life. However, these methods are generally unable to meet today's industrial requirements, either because they are not economically feasible or due to the fact that they can cause severe environmental pollution.

SUMMARY

The present invention discloses a method for forming robust hydrophobic surfaces on a steel workpiece. First, a roughing process is performed on the steel workpiece by removing part of the steel from the surface, so as to form concaves. Second, a depositing process is performed to deposit hydrophobic layers into the concaves, thereby forming the steel workpiece with robust hydrophobic surfaces, exhibiting good abrasion resistance.

In one embodiment, the roughing process furthers comprising:

- performing a sandblasting treatment to the steel workpiece, wherein the sandblasting treatment projects a stream of air mixed with inorganic particles, so as to form a micro-/nanoscale surface roughness;
- performing an electropolishing treatment to the sandblasted steel workpiece, wherein the electropolishing treatment uses the sandblasted steel workpiece as an anode; and
- performing an etching treatment to the electropolished steel workpiece, wherein the etching treatment uses an etching solution containing ferric chloride.

In another embodiment, the depositing process comprises physical vapor deposition (PVD). Preferred, the hydrophobic layers comprise fluorine-containing polymer, which have water contact angle of at least 110 degrees after 1000 times abrasion test.

In still another embodiment, the depositing process comprises sol-gel process. Preferred, the hydrophobic layers comprise silica/epoxy resin hybrid, which have water contact angle of at least 110 degrees after 1000 times abrasion test.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 1 3D white light interferometer figures of pre-treated sample surface after step 1—sandblasting, step 2—electropolishing, and step 3—etching.

FIG. 2A 200, 500, 1000 times abrasion test for PVD and sol-gel samples.

DETAILED DESCRIPTION

Figure 1:
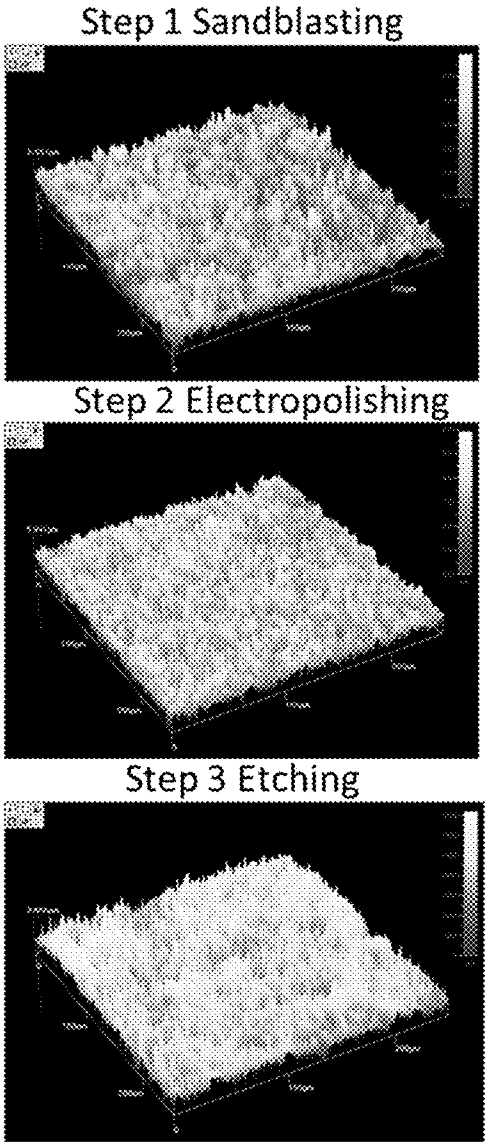

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

Definitions

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

Unless defined otherwise, all technical and scientific terms used herein have the same meaning as commonly understood to one of ordinary skill in the art to which the presently described subject matter pertains.

The invention can be applied on various types of steel surface, such as carbon steel, high speed steel, pearlitic steel, austenitic steel and stainless steel. Stainless steel which is renowned for its good corrosion resistance and excellent mechanical properties has been employed in a wide range of applications like heat exchange, food, power generation, and petrochemical industry. However, there are still some defects caused by its high wettability, resulting in liquids adhesion and corrosion in high humidity environments. The self-cleaning, corrosion-resistant, and antifouling properties of super-hydrophobic surface can effectively solve these problems. Therefore, surfaces modification on stainless steel modification to create super-hydrophobic surface has attracted extensive attention.

The hydrophobicity of a coating depends on its surface chemistry and morphology. In general, a hydrophobic coating has a low surface energy, which results in a water-repellent surface. Coating with a low surface energy will tend to repel water. This is because water molecules are attracted to each other more strongly than to the surface, resulting in a contact angle greater than 90 degrees. So, firstly, low surface energy coatings will be developed with hydrophobic groups, such as fluorine groups with PVD or sol-gel methods.

Secondly, a rough surface can make it difficult for water to wet the surface, resulting in hydrophobicity. This is because the roughness creates air pockets on the surface, which prevents the water droplets from spreading out. And thus, increasing surface roughness is the most important thing that we would like to achieve during the pre-processing steps. Therefore, combination of both coating method and roughing method is our strategy to fabricate hydrophobic or super hydrophobic coatings on stainless steel surface.

In an embodiment, a method for forming robust hydrophobic surfaces on a steel workpiece is provided. The method comprising:

roughing the steel workpiece by removing part of the steel from the surface, so as to form concaves; and depositing hydrophobic layers into the concaves, thereby forming the steel workpiece with robust hydrophobic surfaces, exhibiting good abrasion resistance.

In another embodiment, the roughing process furthers comprises:

performing a sandblasting treatment to the steel workpiece, wherein the sandblasting treatment projects a stream of air mixed with inorganic particles, so as to form a micro-/nanoscale surface roughness;

performing an electropolishing treatment to the sandblasted steel workpiece, wherein the electropolishing treatment uses the sandblasted steel workpiece as an anode; and performing an etching treatment to the electropolished steel workpiece, wherein the etching treatment uses an etching solution containing ferric chloride.

In the sandblasting treatment, the inorganic particles are with particle size ranging from 10 to 40 μm. The stream of air mixed with inorganic particles is blown at a pressure ranging from 2 to 5 bar. The stream of air mixed with inorganic particles is blown from a distance of about 8 to 12 cm from the steel workpiece being treated. After the sandblasting treatment is completed, the surface roughness (Ra) of the sandblasted steel workpiece is more than 600 nm.

In the electropolishing treatment, the electrolyte comprises 50 to 70 wt % concentrated phosphoric acid, 20 to 40 wt % concentrated sulfuric acid, polyethylene glycol, hexamethylenetetramine, citric acid, thiourea, glycerin and water. The electropolishing treatment uses a constant voltage from 3 to 8 V. The time of the electropolishing treatment is between 40 and 100 seconds.

In the etching treatment, the etching solution comprising (1) 1 to 2 M ferric chloride, (2) at least one acid selected from the group consisting of hydrochloric acid and phosphoric acid and mixtures thereof, (3) 1 to 2 M hydrogen peroxide, and (4) water. The concentration of the acid in the etching solution is 1 to 3 M. Moreover, the etching treatment is cooled by water bath, and the temperature of the water bath is between 40 to 60° C. The time of the etching treatment ranges from 40 to 80 minutes. After the etching treatment, the surface of the etched steel workpiece is similar to the surface of a lotus leaf.

In a preferred embodiment, after the roughing process, performing a clean treatment to remove chemical residues and byproducts of the roughed steel workpiece.

In still another embodiment, the depositing process comprises physical vapor deposition (PVD). The depositing process uses a PVD apparatus having a vacuum processing chamber therein equipped with a DC magnetron sputtering cathode, the apparatus being configured to perform physical vapor deposition on the etched steel workpiece in the chamber with process gas maintained therein at a vacuum processing pressure level 1-5 Pa upon the application of power at a sputtering power level 50-100 W to the sputtering cathode. The temperature of the chamber ranges from 20 to 40° C. The sputtering time duration is 30 to 90 minutes.

The hydrophobic layers comprise fluorine-containing polymer or inorganic fluorine-containing compounds. Preferred, the hydrophobic layers comprise perfluoroalkoxy (PFA), which have water contact angle of at least 110 degrees after 1000 times abrasion test. Furthermore, the hydrophobic layers have water contact angle loss of less than 10 degrees after ethanol and washing agent rinsing tests.

In further another embodiment, the depositing process comprises sol-gel process comprises:

providing a sol-gel solution;

coating the sol-gel solution into the concaves of the steel workpiece; and curing the sol-gel solution in the concaves to form the hydrophobic layers, containing silica/epoxy resin hybrid.

The sol-gel solution contains 20 to 30 wt % epoxy resin (E-51), ethanol, 12 to 22 wt % tetraethyl orthosilicate (TEOS), and 35 to 45 wt % 3-aminopropyltriethoxysilane (APTES). The curing temperature ranges from 50° C. to 90° C. Preferred, the hydrophobic layers comprise silica/epoxy resin hybrid, which have water contact angle of at least 110 degrees after 1000 times abrasion test. Furthermore, the hydrophobic layers have water contact angle loss of less than 10 degrees after ethanol and washing agent rinsing tests.

Example 1—Roughing Process

Materials

Stainless steel sheets, with size of 25 mm*75 mm*1 mm, are all undergone rigorous cleaning before subsequent use, including 10 minutes of ultrasonic cleaning with acetone, 10 minutes of ultrasonic cleaning with alcohol, and 10 minutes of ultrasonic cleaning with distilled water. After cleaning, the samples are all dried in a 70 degrees Celsius thermostat.

Pre-Treatment Step 1: Sandblasting

Sandblasting, also called abrasive blasting, is an operation in which a stream of abrasive material is forced against a surface under high pressure to smooth a rough surface, roughen a smooth surface, sculpt a surface, or remove surface contaminants. In detail, aluminum oxide ($Al_2O_3$), with particle size 25 μm, is used as the abrasive to blast the above prepared samples. During sandblasting procedure, the nozzle is kept a consistent distance of 10 cm to the sample surface. The process needs to be manually scanned line by line, keeping the surface as even as possible throughout the process. After sandblasting process, the surface roughness is expected to be increased dramatically.

Pre-Treatment Step 2: Electropolishing

Electropolishing is an electrochemical finishing process that removes a thin surface layer of material from metal parts. The process results in a smoother and cleaner surface.

Electrolyte used for stainless steel typically consist of a highly viscous mixture of sulfuric and phosphoric acids. In detail, before starting to prepare the electrolyte, enough ice cubes and ice water should be prepared to cool down the acid during the mixing process, so as to avoid accidents caused by concentrated acid boiling or splashing out of the container. Firstly, weigh 765 ml of concentrated phosphoric acid with a concentration of 85%, and slowly pour it into a glass container of appropriate size. Secondly, weigh 435 ml of concentrated sulfuric acid with a concentration of 95%, slowly pour it into the concentrated phosphoric acid, and stir with a glass rod or magnet while pouring. This process needs to be carried out in an ice bath, using the ice water and ice cubes to cool the outside of the container in time to avoid accidents. Thirdly, when the acid is mixed evenly and the temperature drops to room temperature, add 8.3424 grams of polyethylene glycol 6000, 2.0856 grams of hexamethylenetetramine, 10.428 grams of citric acid, 0.20856 grams of thiourea, 12 milliliters of glycerin and 48 milliliters of water, and fully stir to mix the solution evenly, and finally get a clear and transparent electrolyte. Lastly, the electrolyte can be stored in a glass container.

During the electropolishing process, the metal part acts as a positively charged anode. The above treated stainless steel sheet after step 1 is connected to the positive terminal of the DC power rectifier. The negatively charged cathode, typically made of zirconium, is connected to the negative terminal of the DC power rectifier. Both the anode and cathode are immersed in a temperature-controlled bath of above prepared electrolyte solution. The temperature is kept under 70 degrees Celsius and the power is kept at 5 V for 40 seconds for each stainless steel sheet in step 2.

After electropolishing process, microscopic smoothness could be improved. It could level peaks and valleys and provides improvement in surface roughness. Unlike mechanical finishing, electropolishing does not smear, bend, stress or fracture the crystalline metal surface. Also, surface defects could be deburred and removed. Electropolishing could remove small pieces of displaced surface material that can seize and break on a microscopic level.

Pre-Treatment Step 3: Etching

The chemical etchant is formulated in the following proportions with iron (III) chloride (also referred to herein as ferric chloride) 16 g, distilled water 60 mL, hydrochloric acid hydrogen chloride acid 2 mL, phosphoric acid 2 mL and hydrogen peroxide 2 mL. Using a magnetic stirrer to stir the solution until homogeneous. The prepared chemical etchant can be stored in a glass container.

During the etching process, the stainless steel sheets treated after step 2 are immersed in the prepared chemical etchant, and kept it in a 50 degrees Celsius water bath for 60 minutes. After etching process, iron easily reacts with hydrochloric acid and ferric chloride to corrode the surface of stainless steel to form a microstructure similar to the surface of a lotus leaf. Then, the treated stainless steel sheets are all undergone rigorous cleaning to remove etchant, including 10 minutes of ultrasonic cleaning with acetone, 10 minutes of ultrasonic cleaning with alcohol, and 10 minutes of ultrasonic cleaning with distilled water. The stainless steel sheets are all dried in a 70 degrees Celsius thermostat after cleaning.

FIG. 1 shows the 3D white light interferometer figures of sample surface after each steps. Mean roughness Ra of sample surface after sandblasting, electropolishing and etching are 670.83, 617.45 and 454.87 nm, respectively. Sandblasting process increases the surface roughness dramatically. And then, electropolishing process deburr and remove surface defects and make surface smoother on a microscopic level. And etching process form a microstructure similar to the surface of a lotus leaf on the surface of the stainless steel sheets surface.

Example 2—Combination of Roughing and Physical Vapor Deposition (PVD)

Perfluoroalkoxy (PFA) is a copolymer of a small amount of perfluoropropyl perfluoroacetaldehyde and polytetrafluoroethylene acetone. Because of the character of PFA and fluorine groups in PFA, the surface of PFA coating is expected to have a low coefficient of friction and be hydrophobic and oleophobic.

PFA coating can be synthesized by a number of methods, including laser irradiation, spray coating and other methods. In this work, the PFA coating are directly deposited by radiofrequency (RF) magneto-sputtering with PFA target (99.9% Pure). In detail, pre-treated stainless steel sheets in Example 1 are put inside the chamber and reach a base environmental pressure level at least 10-4 Pa. The pressure is then increased to 1 Pa with Ar atmosphere and the flow rate is kept at 20 sccm during the whole sputtering process. The sputtering power is under the fixed 100 W RF power and the sputtering power is kept under 100 W.

Figure 2A:
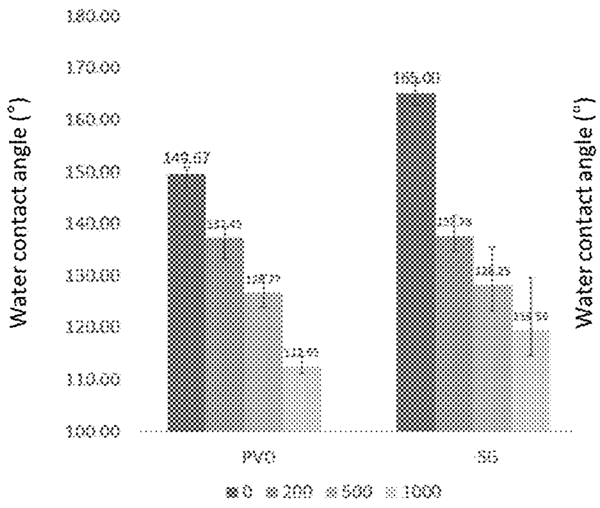
Figure 2B:
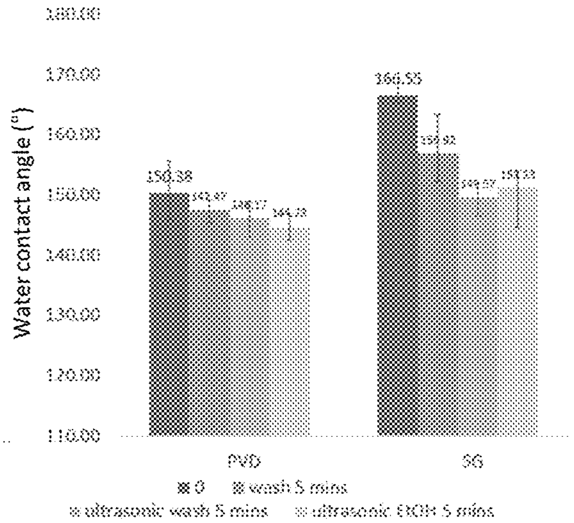
FIG. 2B washing agent and ethanol rinsing test for PVD and sol-gel samples.

After coating with PVD, stainless steel sheets could be hydrophobic as shown in FIG. 2A and FIG. 2B. Stainless steel sheets with PFA PVD coating could achieve an average water contact angle of 150 degrees. Robustness can be checked with abrasion test and rinsing test. As shown in FIG. 2A, water contact angle is been measured after 200, 500 and 1000 times abrasion. After 1000 times abrasion, sample with PVD coating can still remain at 112.65 degrees. The contact angle of the coating surface after 1000 times abrasion test is no less than 110 degrees. As shown in FIG. 2B, water contact angle is been tested after washing agent rinsed for 5 minutes, washing agent ultrasonic rinsed for 5 minutes and ethanol ultrasonic rinsed for 5 minutes. After the above mentioned 15 minutes rinsing, sample with PVD coating can still remain at 144.73 degrees. The coating will not peel off after rinsing tests.

Example 3—Combination of Roughing and Sol-Gel (SG) Deposition

The sol-gel solution is formulated in the following proportions with a mixture of epoxy resin (E-51), ethanol, tetraethyl orthosilicate (TEOS), and 3-aminopropyltriethoxysilane (APTES) in a weight ratio of 26%:17%:17%:40% in a round-bottom flask. Initially, E-51, ethanol, and TEOS were mixed, resulting in a white and turbid mixture. After 10 minutes of stirring, APTES was added, causing the mixture to suddenly become transparent. The resulting organic-inorganic hybrid epoxy resin-based adhesive was stirred continuously at room temperature for 4 hours. The synthesized adhesive, which was transparent, could be stored at room temperature for at least 6 months without any change.

During sol-gel spray process, sol-gel solution is sprayed on the surface of pre-treated stainless steel sheets in Example 1. During sol-gel spray procedure, the nozzle is kept a consistent distance of 10 cm to the sample surface. The process needs to be manually scanned line by line, keeping the surface as even as possible throughout the process. Then, Curing under the temperature of 80 degrees Celsius for 1 hour will be conducted to make the coating more robust. After sol-gel spray process, the surface hydrophobicity is expected to be increased dramatically.

After coating with sol-gel, stainless steel sheets could be hydrophobic as shown in FIG. 2A and FIG. 2B. Stainless steel sheets with sol-gel spray coating could achieve an average water contact angle of 165.3 degrees. Robustness can be checked with abrasion test and rinsing test. As shown in FIG. 2A, water contact angle is been measured after 200, 500 and 1000 times abrasion. After 1000 times abrasion, sample with sol-gel coating can still remain 115.58 degrees. The contact angle of the coating surface after 1000 times abrasion test is no less than 110 degrees. As shown in FIG. 2B, water contact angle is been tested after washing agent rinsed for 5 minutes, washing agent ultrasonic rinsed for 5 minutes and ethanol ultrasonic rinsed for 5 minutes. After the above mentioned 15 minutes rinsing, sample with sol-gel coating can still remain 151.13 degrees. The coating will not peel off after rinsing tests.

In summary, combination of roughing and physical vapor deposition (PVD), and combination of roughing and sol-gel (SG) deposition methods both result in robust hydrophobic coatings.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A method for forming robust hydrophobic surfaces on a steel workpiece, comprising:
- roughing the steel workpiece by removing part of the steel from the surface, so as to form concaves; and
- depositing hydrophobic layers into the concaves, thereby forming the steel workpiece with robust hydrophobic surfaces, exhibiting good abrasion resistance, wherein the roughing process furthers comprises:
- performing a sandblasting treatment to the steel workpiece, wherein the sandblasting treatment projects a stream of air mixed with inorganic particles, so as to form a micro-/nanoscale surface roughness;
- performing an electropolishing treatment to the sandblasted steel workpiece, wherein the electropolishing treatment uses the sandblasted steel workpiece as an anode; and
- performing an etching treatment to the electropolished steel workpiece, wherein the etching treatment uses an etching solution containing ferric chloride.

2. The method of claim 1, wherein the inorganic particles of the sandblasting treatment are with particle size ranging from 10 to 40 μm.

3. The method of claim 1, wherein the stream of air mixed with inorganic particles is blown at a pressure ranging from 2 to 5 bar.

4. The method of claim 1, wherein the surface roughness (Ra) of the sandblasted steel workpiece is more than 600 nm.

5. The method of claim 1, wherein an electrolyte of the electropolishing treatment comprising 50 to 70 wt % concentrated phosphoric acid, 20 to 40 wt % concentrated sulfuric acid, polyethylene glycol, hexamethylenetetramine, citric acid, thiourea, glycerin and water.

6. The method of claim 1, wherein the electropolishing treatment uses a constant voltage from 3 to 8 V.

7. The method of claim 1, wherein the etching solution of the etching treatment comprising (1) 1 to 2 M ferric chloride, (2) at least one acid selected from the group consisting of hydrochloric acid and phosphoric acid and mixtures thereof, (3) 1 to 2 M hydrogen peroxide, and (4) water.

8. The method of claim 7, wherein the concentration of the acid in the etching solution is 1 to 3 M.

9. The method of claim 1, wherein the etching treatment is cooled by water bath, the temperature of the water bath is between 40 to 60° C.

10. The method of claim 1, wherein the surface of the etched steel workpiece is similar to the surface of a lotus leaf.

11. The method of claim 1, after the roughing process, performing a clean treatment to remove chemical residues and byproducts of the roughed steel workpiece.

12. The method of claim 1, wherein the depositing process comprises physical vapor deposition (PVD).

13. The method of claim 12, wherein the depositing process uses a PVD apparatus having a vacuum processing chamber therein equipped with a DC magnetron sputtering cathode, the apparatus being configured to perform physical vapor deposition on the etched steel workpiece in the chamber with process gas maintained therein at a vacuum processing pressure level 1-5 Pa upon the application of power at a sputtering power level 50-100 W to the sputtering cathode.

14. The method of claim 13, wherein the temperature of the chamber ranges from 20 to 40° C.

15. The method of claim 1, wherein the hydrophobic layers comprise fluorine-containing polymer or inorganic fluorine-containing compounds.

16. The method of claim 15, wherein the hydrophobic layers comprise perfluoroalkoxy (PFA).

17. The method of claim 12, wherein the steel workpiece with robust hydrophobic surfaces comprises one or any combination or all of the following properties:
- (1) the average water contact angle equal to or greater than 150 degrees;
- (2) the water contact angle of at least 110 degrees after 1000 times abrasion test;
- (3) the water contact angle loss of less than 10 degrees after ethanol and washing agent rinsing tests.

18. The method of claim 1, wherein the depositing process comprises sol-gel process.

19. The method of claim 18, wherein the sol-gel process comprises:
- providing a sol-gel solution;
- coating the sol-gel solution into the concaves of the steel workpiece; and
- curing the sol-gel solution in the concaves to form the hydrophobic layers, containing silica/epoxy resin hybrid.

20. The method of claim 19, wherein the sol-gel solution contains 20 to 30 wt % epoxy resin (E-51), ethanol, 12 to 22 wt % tetraethyl orthosilicate (TEOS), and 35 to 45 wt % 3-aminopropyltriethoxysilane (APTES).

21. The method of claim 19, wherein the curing temperature ranges from 50° C. to 90° C.

22. The method of claim 18, wherein the steel workpiece with robust hydrophobic surfaces comprises one or any combination or all of the following properties:

(1) the average water contact angle equal to or greater than 150 degrees;

(2) the water contact angle of at least 110 degrees after 1000 times abrasion test;

(3) the water contact angle loss of less than 10 degrees after ethanol and washing agent rinsing tests.

* * * * *